(12) United States Patent
Park et al.

(10) Patent No.: US 9,820,383 B2
(45) Date of Patent: Nov. 14, 2017

(54) MULTILAYER CERAMIC CAPACITOR HAVING THREE EXTERNAL ELECTRODES AND BOARD HAVING THE SAME

(71) Applicant: SAMSUNG ELECTRO-MECHANICS CO., LTD., Suwon-si, Gyeonggi-do (KR)

(72) Inventors: Min Cheol Park, Suwon-si (KR); Young Ghyu Ahn, Suwon-si (KR); Kyo Kwang Lee, Suwon-si (KR)

(73) Assignee: SAMSUNG ELECTRO-MECHANICS CO., LTD., Suwon-si, Gyeonggi-do (KR)

(*) Notice: Subject to any disclaimer, the term of this patent is extended or adjusted under 35 U.S.C. 154(b) by 0 days.

(21) Appl. No.: 15/403,988

(22) Filed: Jan. 11, 2017

(65) Prior Publication Data

US 2017/0127522 A1    May 4, 2017

Related U.S. Application Data

(63) Continuation of application No. 14/522,533, filed on Oct. 23, 2014, now abandoned.

(30) Foreign Application Priority Data

Oct. 31, 2013  (KR) .................. 10-2013-0131105
Aug. 5, 2014  (KR) .................. 10-2014-0100597

(51) Int. Cl.
*H05K 1/18*    (2006.01)
*H01G 4/12*    (2006.01)
(Continued)

(52) U.S. Cl.
CPC ............. *H05K 1/181* (2013.01); *H01G 4/012* (2013.01); *H01G 4/12* (2013.01); *H01G 4/232* (2013.01); *H01G 4/248* (2013.01); *H01G 4/30* (2013.01); *H05K 1/111* (2013.01); *H05K 2201/10015* (2013.01)

(58) Field of Classification Search
CPC .......... H01G 4/12; H01G 4/232; H01G 2/065; H01G 4/30
See application file for complete search history.

(56) References Cited

U.S. PATENT DOCUMENTS 4,590,537 A    5/1986   Sakamoto
6,768,630 B2   7/2004   Togashi
(Continued)

FOREIGN PATENT DOCUMENTS

KR    10-2008-0073193 A    8/2008

OTHER PUBLICATIONS

U.S. Non-Final Office Action dated Mar. 14, 2016 issued in U.S. Appl. No. 14/522,533.
(Continued)

*Primary Examiner* — David M Sinclair
(74) *Attorney, Agent, or Firm* — McDermott Will & Emery LLP (57) ABSTRACT

A multilayer ceramic capacitor may include three external electrodes disposed on amounting surface of a ceramic body to be spaced apart from one another. When a length of the ceramic body is defined as L, and a width of an active region including a plurality of internal electrodes disposed therein in a width direction of the ceramic body is defined as A, A/L is in a range of 0.64 to 1.14 (0.64≤A/L≤1.14).

23 Claims, 10 Drawing Sheets (51) Int. Cl.
*H01G 4/232* (2006.01)
*H01G 4/30* (2006.01)
*H05K 1/11* (2006.01)
*H01G 4/012* (2006.01)
*H01G 4/248* (2006.01)

(56) References Cited

U.S. PATENT DOCUMENTS

| | | |
|---|---|---|
| 6,950,300 B2 | 9/2005 | Sutardja |
| 8,238,116 B2 | 8/2012 | Eggerding et al. |
| 2003/0099085 A1 | 5/2003 | Duva |
| 2008/0144253 A1 | 6/2008 | Togashi |
| 2008/0186652 A1 | 8/2008 | Lee et al. |
| 2008/0297976 A1 | 12/2008 | Togashi et al. |
| 2009/0086406 A1 | 4/2009 | Lee et al. |
| 2010/0149769 A1 | 6/2010 | Lee et al. |
| 2012/0188684 A1 | 7/2012 | Akazawa et al. |

OTHER PUBLICATIONS

U.S. Final Office Action dated Aug. 18, 2016 issued in U.S. Appl. No. 14/522,533.

MULTILAYER CERAMIC CAPACITOR HAVING THREE EXTERNAL ELECTRODES AND BOARD HAVING THE SAME

CROSS-REFERENCE TO RELATED APPLICATION

This application is a Continuation Application of U.S. patent application Ser. No. 14/522,533, filed Oct. 23, 2014 which claims the benefit of Korean Patent Application No. 10-2013-0131105 filed on Oct. 31, 2013 and Korean Patent Application No. 10-2014-0100597 filed on Aug. 5, 2014 with the Korean Intellectual Property Office, the disclosures of which are incorporated herein by reference.

BACKGROUND

The present disclosure relates to a multilayer ceramic capacitor and a board having the same.

In accordance with the recent trend toward miniaturization and high capacitance of electronic products, a demand for miniaturization and high capacitance of electronic components used in electronic products has increased.

In the case of a multilayer ceramic capacitor, when equivalent series inductance (ESL) increases, performance of an electronic product may deteriorate. Moreover, as the electronic component becomes miniaturized and has high capacitance, an influence of an increase in ESL of the multilayer ceramic capacitor on deterioration of performance of the electronic component becomes greater.

Particularly, in accordance with increasingly high performance of an integrated circuit, use of a decoupling capacitor is increasing. Therefore, a demand is rising for a multilayer ceramic capacitor (MLCC) having a 3-terminal vertical structure, so-called "low inductance chip capacitor (LICC)" capable of reducing inductance of the capacitor by reducing a distance between external terminals to decrease a current flow path.

SUMMARY

An exemplary embodiment in the present disclosure may provide a multilayer ceramic capacitor capable of significantly increasing low ESL characteristics and a board having the same.

According to An exemplary embodiment in the present disclosure, a multilayer ceramic capacitor may include three external electrodes disposed on a mounting surface of a ceramic body to be spaced apart from one another, wherein when a length of the ceramic body is defined as L, and a width of an active region including a plurality of internal electrodes disposed therein is defined as A, A/L is in a range of 0.64 to 1.14 ($0.64 \leq A/L \leq 1.14$).

BRIEF DESCRIPTION OF DRAWINGS

The above and other aspects, features and advantages of the present disclosure will be more clearly understood from the following detailed description taken in conjunction with the accompanying drawings, in which.

DETAILED DESCRIPTION

Exemplary embodiments in the present disclosure will now be described in detail with reference to the accompanying drawings.

The disclosure may, however, be exemplified in many different forms and should not be construed as being limited to the specific embodiments set forth herein. Rather, these embodiments are provided so that this disclosure will be thorough and complete, and will fully convey the scope of the disclosure to those skilled in the art.

In the drawings, the shapes and dimensions of elements maybe exaggerated for clarity, and the same reference numerals will be used throughout to designate the same or like elements.

Directions of a hexahedral ceramic body will be defined in order to clearly describe exemplary embodiments in the present disclosure. L, W and T shown in FIG. 1 refer to a length direction, a width direction, and a thickness direction, respectively. Here, the width direction may be the same as a direction in which dielectric layers are stacked.

Multilayer Ceramic Capacitor

Figure 1:
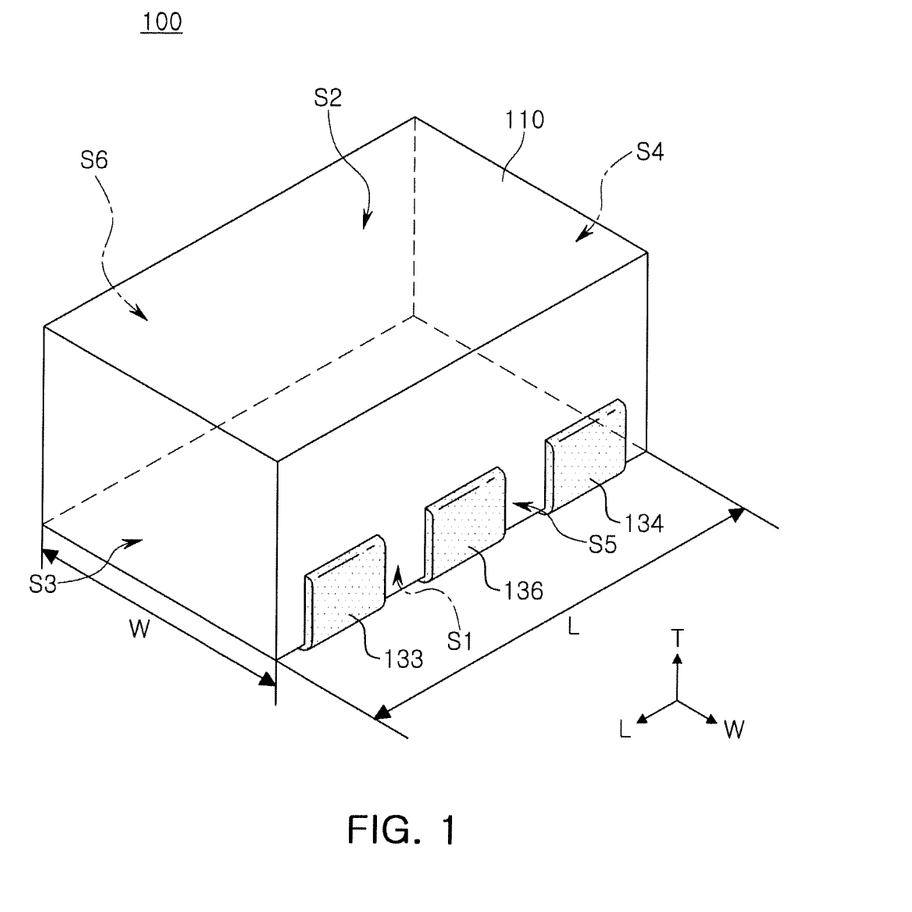
FIG. 1 is a perspective view schematically illustrating a multilayer ceramic capacitor according to an exemplary embodiment in the present disclosure.
Figure 2:
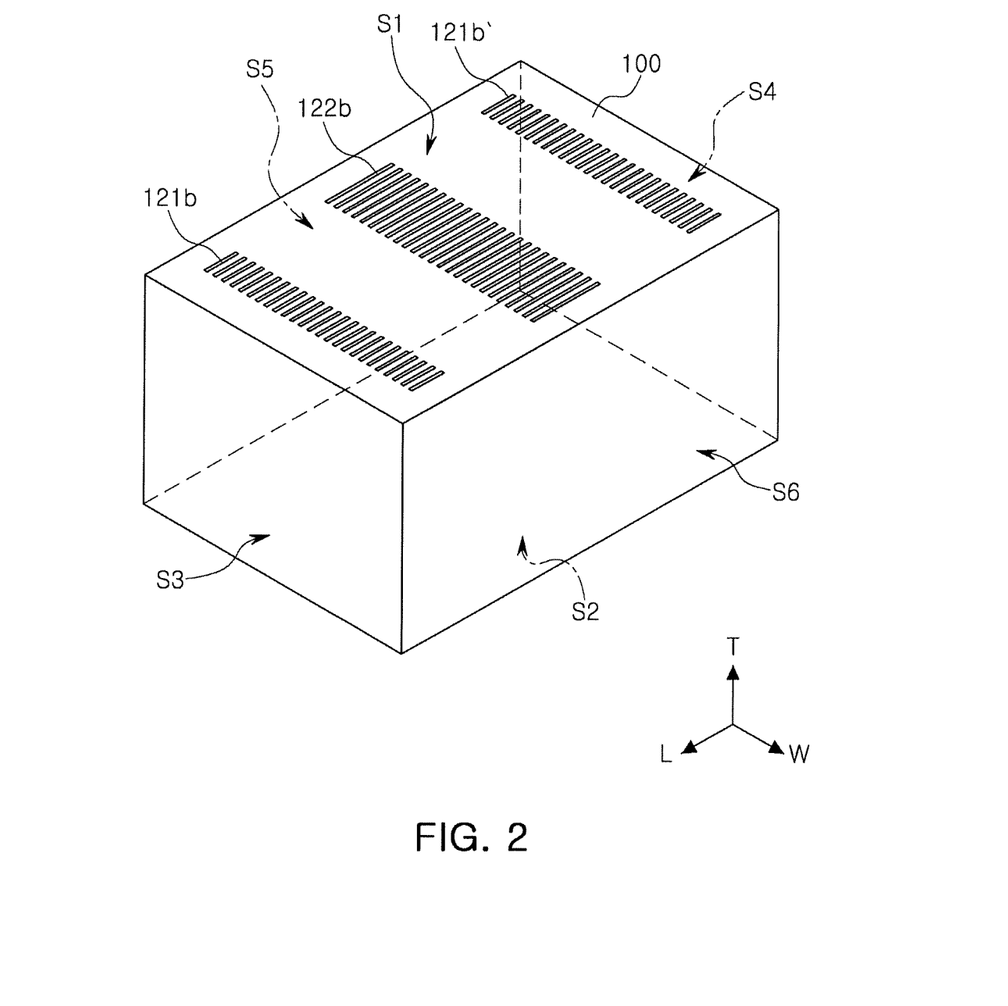
FIG. 2 is a perspective view illustrating a ceramic body of the multilayer ceramic capacitor of FIG. 1 which is overturned.
Figure 3:
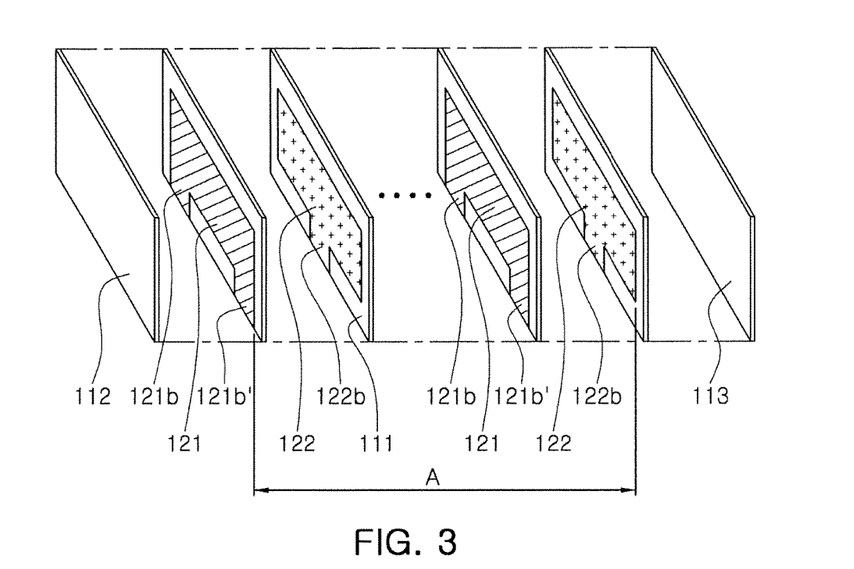
FIG. 3 is an exploded perspective view illustrating the multilayer ceramic capacitor of FIG. 1 in a state in which external electrodes thereof are omitted.
Figure 4:
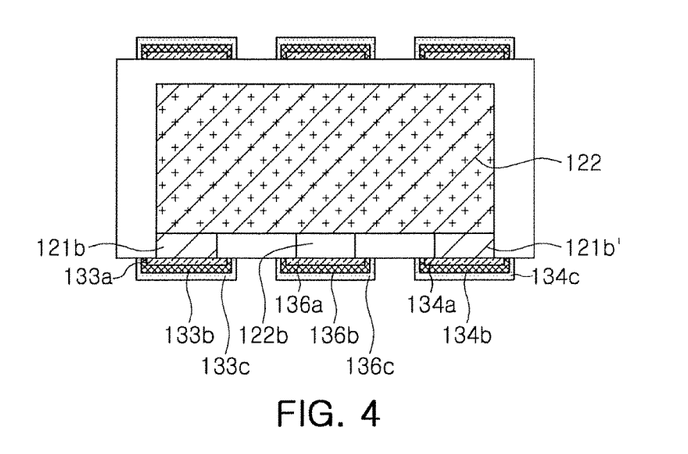
FIG. 4 is a cross-sectional view illustrating the multilayer ceramic capacitor of FIG. 1.

FIG. 1 is a perspective view schematically illustrating a multilayer ceramic capacitor according to an exemplary embodiment of the present disclosure, FIG. 2 is a perspective view illustrating a ceramic body of the multilayer ceramic capacitor of FIG. 1 which is overturned; FIG. 3 is an exploded perspective view illustrating the multilayer ceramic capacitor of FIG. 1 in a state in which external electrodes thereof are omitted; FIG. 4 is a cross-sectional view illustrating the multilayer ceramic capacitor of FIG. 1.

Referring to FIGS. 1 through 4, a multilayer ceramic capacitor 100 according to the present exemplary embodiment may include a ceramic body 110 in which a plurality of dielectric layers 111 are stacked in the width direction of the ceramic body 110, an active region including a plurality of first and second internal electrodes 121 and 122, and first to third external electrodes 133, 134, and 136.

That is, the multilayer ceramic capacitor 100 according to the present exemplary embodiment may be considered as a 3-terminal capacitor having a total of three external terminals.

In the present exemplary embodiment, when a length of the ceramic body 110 is defined as L, and a width of the active region is defined as A, A/L may be in a range of 0.64 to 1.14 ($0.64 \leq A/L \leq 1.14$).

The ceramic body 110 may have first and second main surfaces S1 and S2 opposing each other in the thickness direction thereof, first and second end surfaces S3 and S4 connecting the first and second main surfaces S1 and S2 to each other and opposing each other in the length direction, and third and fourth side surfaces S5 and S6 opposing each other in the width direction thereof.

Hereinafter, in the present exemplary embodiment, a mounting surface of the multilayer ceramic capacitor 100 may be the first main surface S1 of the ceramic body 110.

The ceramic body 110 may be formed by stacking the plurality of dielectric layers 111 in the width direction and then sintering the stacked dielectric layers 111. A shape of the ceramic body 110 is not particularly limited, but the ceramic body 110 may have a hexahedral shape as shown in the accompanying drawings.

In the present exemplary embodiment, when the length of the ceramic body 110 is defined as L and a width of the ceramic body 110 is defined as W, W/L may be in a range of 0.7 to 1.2 ($0.7 \leq W/L \leq 1.2$).

Figure 14:
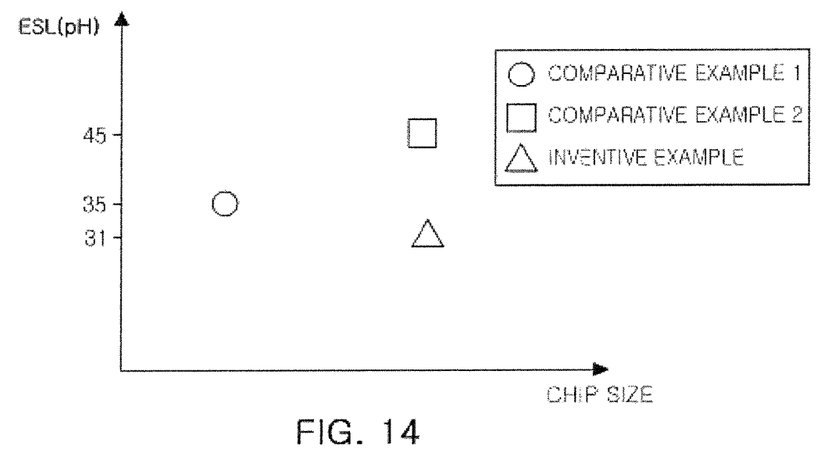
FIG. 14 is a graph illustrating comparison results of ESL characteristics of multilayer ceramic capacitors according to size.

FIG. 14 is a graph showing comparison results of ESL characteristics according to a chip size.

Here, a chip in Comparative Example 1 had a size of 1.6×0.8 mm (length×width), a chip in Comparative Example 2 had a size of 1.0×0.5 mm (length×width), and a chip in Inventive Example had a size of 1.0×0.8 mm (length×width) which had a decreased length as compared to the chip in Comparative Example 1.

Referring to FIG. 14, it can be seen that ESL of the chip in Comparative Example 1 was 35 pH, and ESL of the chip in Comparative Example 2 was 45 pH, higher than that in Comparative Example 1; however, in the case of Inventive Example in which only the length of the chip is decreased as compared with Comparative Example 1 so that W/L is 0.8, ESL was 31 pH, lower than those in Comparative Examples 1 and 2.

In the case in which W/L is less than 0.7, it may be difficult to obtain low ESL. In the case in which W/L is greater than 1.2, that is, in the case in which the width of the ceramic body 110 is excessively increased as compared to the length thereof, a cutting defect may significantly occur during a process of manufacturing the multilayer ceramic capacitor. Thus, W/L is set to 1.0 or less so that the cutting defect may not occur during the manufacturing process.

In addition, the length of the ceramic body 110 may be 0.8 mm or greater. In the case in which the length of the ceramic body 110 is less than 0.8 mm, a length of lead portions of the first and second internal electrodes in the length direction may be decreased, such that equivalent series resistance (ESR) may be increased.

An increase in ESR may cause increased heat generation and lowered efficiency of the chip.

In addition, the plurality of dielectric layers 111 forming the ceramic body 110 may be in a sintered state. Adjacent dielectric layers 111 may be integrated so that boundaries therebetween are not readily apparent without using a scanning electron microscope (SEM).

The ceramic body 110 may include the active region including the plurality of internal electrodes and contributing to forming capacitance of the capacitor and cover layers 112 and 113 formed on first and second side surfaces of the active region, respectively, as margin regions in the width direction.

The active region may be formed by repeatedly stacking the plurality of first and second internal electrodes 121 and 122 in the width direction, having at least one of the dielectric layers 111 interposed therebetween.

In the present exemplary embodiment, when the length of the ceramic body 110 is defined as L and the width of the active region is defined as A, A/L may be in a range of 0.64 to 1.14 ($0.64 \leq A/L \leq 1.14$). More preferably, in order to prevent the cutting defect during the process of manufacturing the multilayer ceramic capacitor, A/L may be in a range of 0.94 or less.

When the length of the ceramic body 110 and the width of the active region are numerically limited as in the present exemplary embodiment, the active region, that is, a capacitance portion, may be formed while maximally utilizing the width of the dielectric layers 111, whereby low ESL may be achieved and a maximum capacitance of the multilayer ceramic capacitor may be secured at a predetermined level.

Meanwhile, in the present exemplary embodiment, the cover layers 112 and 113 may be formed to have a minimum thickness in order to generate various levels of capacitance of the capacitor while maintaining low ESL.

In a capacitor having a vertically stacked structure as in the present exemplary embodiment, when the width of the active region is decreased, a width of a current path is decreased, and thus, ESL is increased.

In the present exemplary embodiment, the active region maybe formed to have a predetermined width or more with respect to the length of the ceramic body 110, and thus low ESL may be obtained so as to be a predetermined level or less.

In this case, the thickness of the dielectric layer 111 may be optionally changed according to target capacitance of the multilayer ceramic capacitor 100, but may be 0.01 µm to 1.00 µm after sintering. However, the present disclosure is not limited thereto.

Further, the dielectric layers 111 may contain ceramic powder having high permittivity, for example, barium titanate ($BaTiO_3$) based powder, strontium titanate ($SrTiO_3$) based powder, or the like, but the ceramic powder is not limited thereto as long as sufficient capacitance may be obtained.

In addition, if necessary, a ceramic additive, an organic solvent, a plasticizer, a binder, a dispersant, and the like, together with the ceramic powder, may be further added to form the dielectric layers 111.

In addition, an average particle size of the ceramic powder used to form the dielectric layers 111 is not particularly limited and may be controlled in order to achieve the purpose of the present disclosure. For example, the average particle size may be controlled to be 400 nm or less.

The cover layers 112 and 113 may have the same material and configuration as those of the dielectric layers 111, except that internal electrodes are not included therein.

In addition, the cover layers 112 and 113 may be formed by having a single dielectric layer or at least two dielectric layers stacked on both side surfaces of the active region in the width direction, respectively, and may generally serve to prevent the first and second internal electrodes 121 and 122 from being damaged by physical or chemical stress.

The first and second internal electrodes 121 and 122 having different polarities may be formed inside the ceramic body 110 and disposed to face each other, having each dielectric layer 111 interposed therebetween. In this case, the first and second internal electrodes 121 and 122 may be electrically insulated from each other by the dielectric layer 111 disposed therebetween.

In addition, the first and second internal electrodes 121 and 122 may be disposed to be spaced apart from the first and second end surfaces S3 and S4 of the ceramic body 110 in the length direction by a predetermined distance.

Each of the first and second internal electrodes 121 and 122 may include a capacitance portion overlapped with an internal electrode adjacent thereto to contribute to forming capacitance and a lead portion extended from the capacitance portion to be led-out to the outside of the ceramic body 110.

In this case, a length of the lead portion is not particularly limited, but for example, maybe shorter than that of the capacitance portion in the length direction of the ceramic body 110.

Further, the thickness of the first and second internal electrodes 121 and 122 may be determined according to intended use of the capacitor. For example, the thickness of the first and second internal electrodes 121 and 122 may be determined to be in a range of 0.2 μm to 1.0 μm in consideration of the size of the ceramic body 110, but is not limited thereto.

In addition, a material forming the first and second internal electrodes 121 and 122 is not particularly limited. For example, the first and second internal electrodes 121 and 122 may be formed using a conductive paste formed of at least one of a noble metal material such as palladium (Pd), a palladium-silver (Pd—Ag) alloy, or the like, nickel (Ni), and copper (Cu).

Further, as a method of printing the conductive paste, a screen printing method, a gravure printing method, or the like, maybe used, but the present disclosure is not limited thereto.

In the present exemplary embodiment, first and second lead portions 121b and 121b' may be disposed to be spaced apart from each other in the length direction of the ceramic body 110, and extended from the first internal electrode 121 so as to be exposed to the first main surface S1, which is amounting surface of the ceramic body 110.

A third lead portion 122b may be disposed between the first and second lead portions 121b and 121b' and extended from the second internal electrode 122 so as to be exposed to the first main surface S1 of the ceramic body 110.

The first and second external electrodes 133 and 134, having the same polarity, may be disposed on the first main surface S1 of the ceramic body 110 so as to be spaced apart from each other in the length direction of the ceramic body 110 and contact the first and second lead portions 121b and 121b' exposed to the first main surface S1 of the ceramic body 110, respectively, to thereby be electrically connected thereto.

The first and second external electrodes 133 and 134 may be extended from the first main surface S1 of the ceramic body 110 to portions of the third and fourth side surfaces S5 and S6 of the ceramic body 110 in the width direction thereof.

The third external electrode 136, having a different polarity from that of the first and second external electrodes 133 and 134, maybe utilized as a ground terminal in the present exemplary embodiment.

The third external electrode 136 may be disposed between the first and second external electrodes 133 and 134 and contacts the third lead portion 122b exposed to the first main surface S1 of the ceramic body 110 to thereby be electrically connected thereto.

The third external electrode 136 may be extended from the first main surface S1 of the ceramic body 110 to portions of the third and fourth side surfaces S5 and S6 of the ceramic body 110 in the width direction thereof.

In a general multilayer ceramic electronic component, external electrodes may be disposed on end surfaces of a ceramic body opposing each other in a length direction thereof.

In this case, when alternating current (AC) voltage is applied to the external electrodes, a current path is relatively long, and thus, a current loop may be relatively large, and an intensity of induced magnetic field may be increased, resulting in an increase in inductance.

In order to solve this problem, according to the exemplary embodiment in the present disclosure, the third external electrode 136 may be disposed between the first and second external electrodes 133 and 134 on the first main surface S1 of the ceramic body 110 so as to decrease the current path.

The first to third external electrodes 133, 134, and 136 may have a three layer structure and include first to third conductive layers 133a, 134a, and 136a connected to the corresponding lead portions of the internal electrodes, respectively, first to third nickel (Ni) plating layers 133b, 134b, and 136b formed to cover the first to third conductive layers 133a, 134a, and 136a, and first to third tin (Sn) plating layers 133c, 134c, and 136c formed to cover the first to third nickel plating layers 133b, 134b, and 136b.

The first to third conductive layers 133a, 134a, and 136a may be formed of the same conductive material as that of the first and second internal electrodes 121 and 122, but are not limited thereto. For example, the first to third conductive layers 133a, 134a, and 136a may be formed of a metal powder including copper (Cu), silver (Ag), nickel (Ni), or the like, and formed by applying a conductive paste prepared by adding glass frit to the metal powder to the outer surfaces of the ceramic body and then sintering the applied conductive paste.

Experimental Examples

Multilayer ceramic capacitors according to Inventive Examples and Comparative Examples were manufactured as follows.

Slurry containing a barium titanate ($BaTiO_3$) powder, or the like, was applied to carrier films and dried to prepare a plurality of ceramic green sheets having a thickness of 1.8 μm.

Next, a conductive paste for nickel internal electrodes was applied to the ceramic green sheet using a screen to thereby forma first internal electrode having a pair of first and second lead portions exposed to first main surface of the ceramic green sheet and a second internal electrode having a third lead portion spaced apart from the first and second lead portions and exposed to the first main surface of the ceramic green sheet.

Then, about 150 to 400 ceramic green sheets were stacked, and ceramic green sheets on which first and second internal electrodes are not formed were further stacked on both side surfaces, thereby manufacturing a multilayer body. Thereafter, isostatic pressing was performed on the multilayer body at 85° C. and 1000 kgf/cm$^2$.

Next, the pressed ceramic multilayer body was cut into individual chips, and each chip was subjected to a de-binding process by being maintained at about 230° C. for 60 hours under air atmosphere.

Then, the chip was sintered at about 1,200° C. under reducing atmosphere having oxygen partial pressure of $10^{-11}$ atm to $10^{-10}$ atm lower than Ni—NiO equilibrium oxygen partial pressure so that the internal electrodes were not oxidized, thereby forming a ceramic body.

After sintering, a length of the multilayer ceramic capacitor was about 1.0 mm, and a width thereof was varied from 0.5 mm to 1.3 mm. Here, a manufacturing tolerance was determined in a range of ±0.1 mm (length×width (L×W)).

Thereafter, a process of forming first to third external electrodes was performed on a first main surface of the ceramic body so as to correspond to the lead portions of the first and second internal electrodes, respectively, whereby each multilayer ceramic capacitor was manufactured. Tests for measuring a cutting defect rate (%) and equivalent serial inductance (ESL) were performed with respect to 100 samples. The test results are shown in Table 1.

TABLE 1

| # | Width (W) of Ceramic Body | Width (A) of Active Region | Number of Stacked Internal Electrodes | ESL (pH) | Cutting Defect Rate (%) |
|---|---|---|---|---|---|
| 1 | 0.5 mm | 0.34 mm | 150 | 60.1 | 0 |
| 2 | 0.5 mm | 0.44 mm | 150 | 48.4 | 0 |
| 3 | 0.5 mm | 0.44 mm | 250 | 49.2 | 0 |
| 4 | 0.6 mm | 0.44 mm | 250 | 48.7 | 0 |
| 5 | 0.6 mm | 0.54 mm | 250 | 40.6 | 0 |
| 6 | 0.6 mm | 0.54 mm | 400 | 40.1 | 0 |
| 7 | 0.7 mm | 0.64 mm | 400 | 31.1 | 0 |
| 8 | 0.8 mm | 0.74 mm | 400 | 27.4 | 0 |
| 9 | 0.9 mm | 0.84 mm | 400 | 24.1 | 0 |
| 10 | 1.0 mm | 0.94 mm | 400 | 21.2 | 0 |
| 11 | 1.1 mm | 1.04 mm | 400 | 19.6 | 4% |
| 12 | 1.2 mm | 1.14 mm | 400 | 18.5 | 6% |
| 13 | 1.3 mm | 1.24 mm | 400 | 17.4 | 22% |

* Length (L) of Ceramic Body = 1.0 mm

Referring to Table 1 and FIG. 14, in samples 1 and 2 and in samples 4 and 5, in which the widths of the ceramic bodies were the same as each other and the widths of the active regions became increased, ESL was lowered. That is, it can be seen that in order to decrease ESL, the width of the active region needs to be increased.

Further, it can be seen that in samples 2 and 3 and in samples 5 and 6, in which the widths of the active regions were the same as each other, even when the number of stacked internal electrodes was different, that is, even when the level of capacitance was different, there was little difference in ESL according to a difference in capacitance.

In addition, it can be seen that in samples 3 and 4, in which the widths of the ceramic bodies became increased and the widths of the active regions were the same as each other, there was little difference in ESL.

Therefore, a factor having a large influence on ESL is the width of the active region, and in order to obtain the maximum capacitance and low ESL, it is necessary to increase the width of the active region while maximally using the width of the ceramic body.

When the length of the ceramic body is defined as L and the length of the active region is defined as A, in samples 7 to 12 in which A/L was in a range of 0.64 to 1.14 (0.64≤A/L≤1.14), ESL was 32 pH or less, and the cutting defect rate was low (10% or less).

Further, in sample 13 in which A/L was greater than 1.14, the cutting defect rate was significantly high (22%).

In addition, in samples 1 to 11 in which A/L was 0.94 or less, the cutting defect did not occur.

Modified Examples

Figure 5:
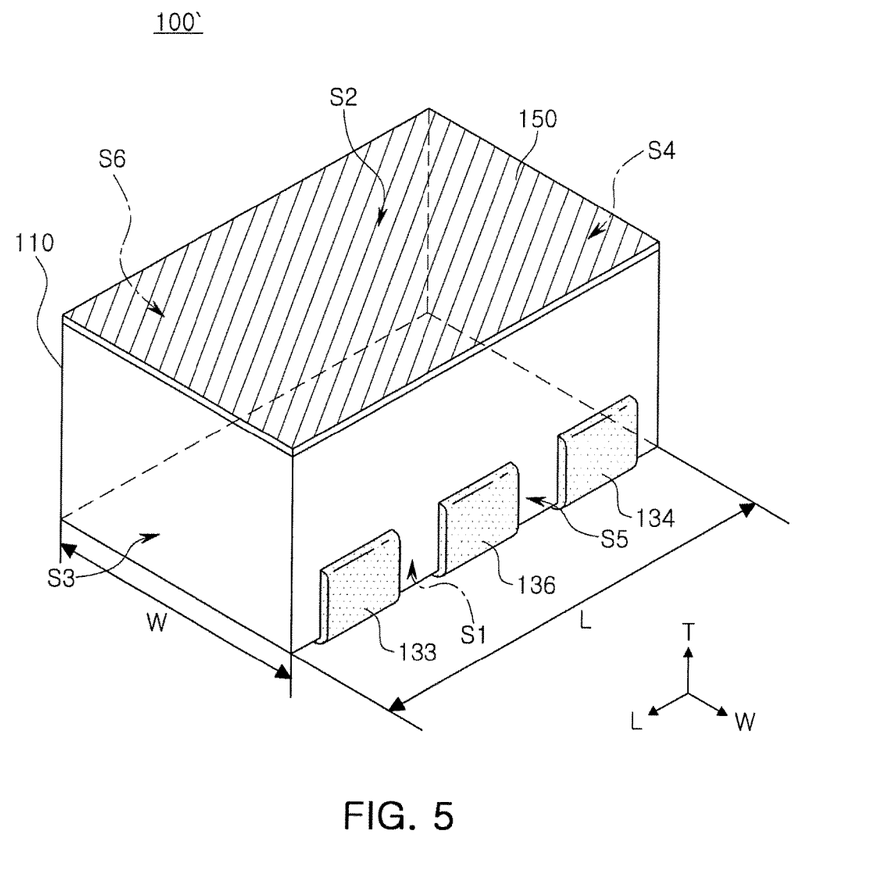
FIG. 5 is a perspective view schematically illustrating a multilayer ceramic capacitor according to another exemplary embodiment in the present disclosure.
Figure 6:
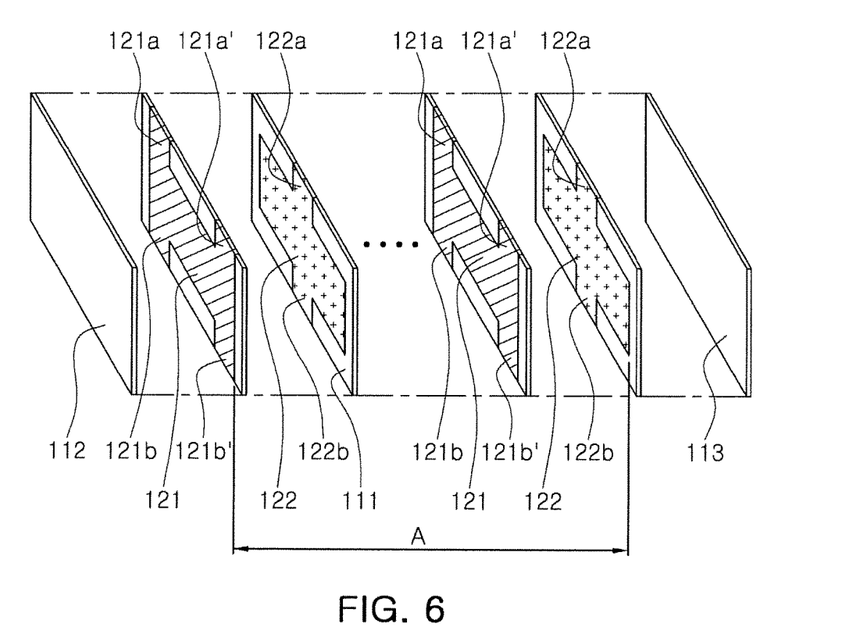
FIG. 6 is an exploded perspective view illustrating the multilayer ceramic capacitor of FIG. 5 in a state in which external electrodes thereof are omitted.

FIG. 5 is a perspective view schematically illustrating a multilayer ceramic capacitor according to another exemplary embodiment in the present disclosure; FIG. 6 is an exploded perspective view illustrating the multilayer ceramic capacitor of FIG. 5 in a state in which external electrodes thereof are omitted; and FIG. 7 is a cross-sectional view illustrating the multilayer ceramic capacitor of FIG. 5.

Here, since a structure of a ceramic body 110 in the present embodiment is the same as that in the previous exemplary embodiment, a detailed description thereof will be omitted in order to avoid an overlapped description, and first and second internal electrodes 121 and 122 having different structures from those in the previous exemplary embodiment and an insulating layer 150 will be described in detail.

Figure 7:
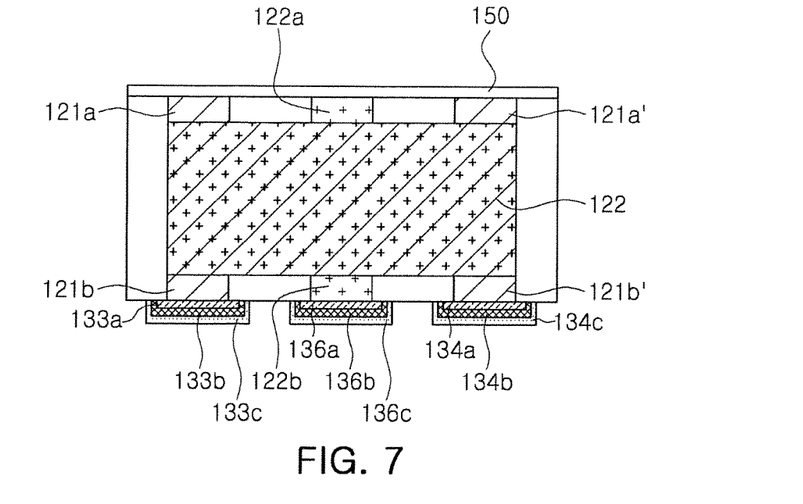
FIG. 7 is a cross-sectional view illustrating the multilayer ceramic capacitor of FIG. 5.

Referring to FIGS. 5 through 7, the insulating layer 150 may be disposed on a second main surface S2 of the ceramic body 110 opposing a mounting surface of the ceramic body 110 of the multilayer ceramic capacitor 100' according to the present exemplary embodiment.

The first internal electrode 121 may have fourth and fifth lead portions 121a and 121a' exposed to the second main surface S2 of the ceramic body 110 to contact the insulating layer 150 formed on the second main surface S2 of the ceramic body 110.

The second internal electrode 122 may have a sixth lead portion 122a disposed between the fourth and fifth lead portions 121a and 121a' and exposed to the second main surface S2 of the ceramic body 110 to contact the insulating layer 150.

Figure 8:
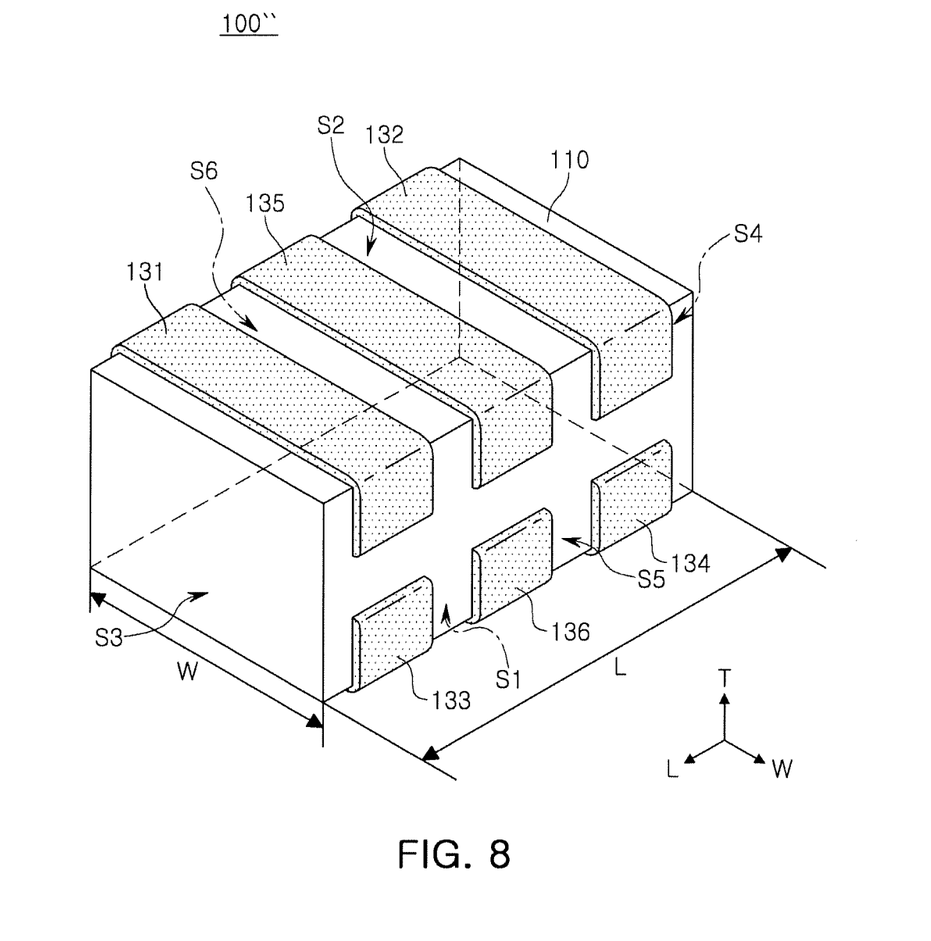
FIG. 8 is a perspective view schematically illustrating a multilayer ceramic capacitor according to another exemplary embodiment in the present disclosure.
Figure 9:
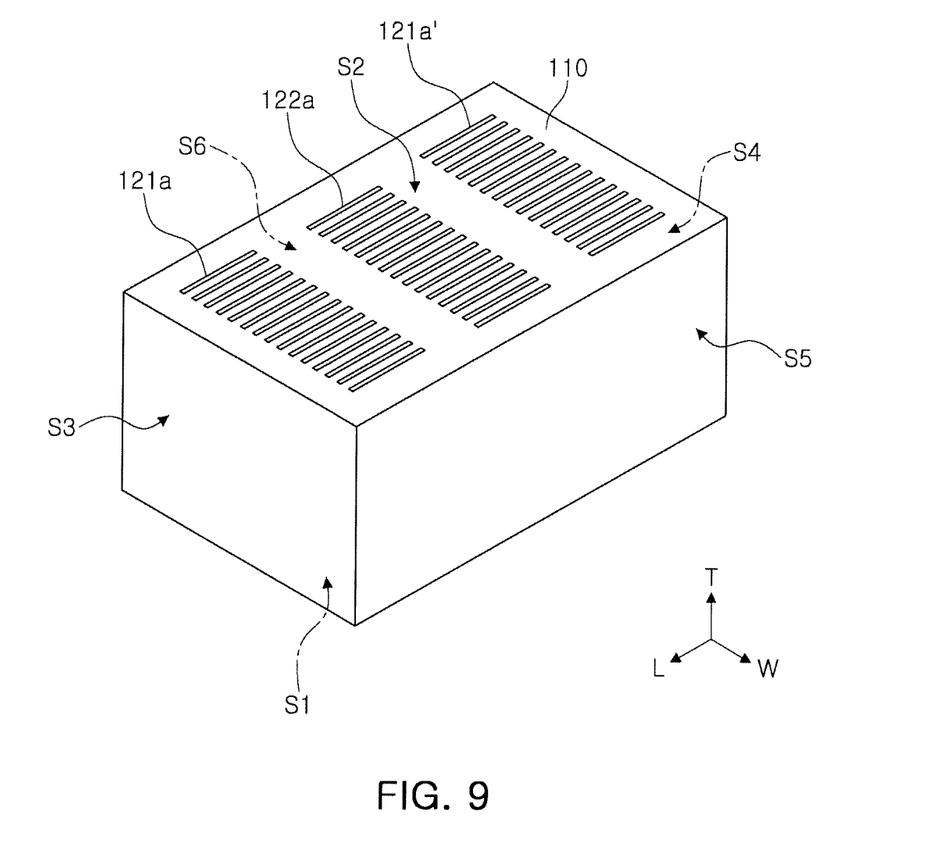
FIG. 9 is a perspective view illustrating a ceramic body of the multilayer ceramic capacitor of FIG. 8.
Figure 10:
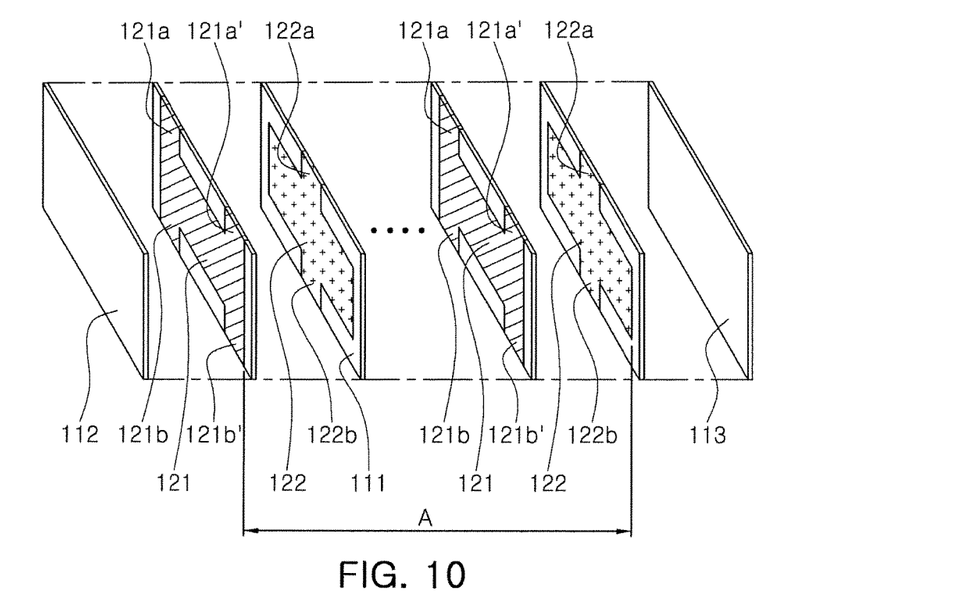
FIG. 10 is an exploded perspective view illustrating the multilayer ceramic capacitor of FIG. 8 in a state in which external electrodes thereof are omitted.
Figure 11:
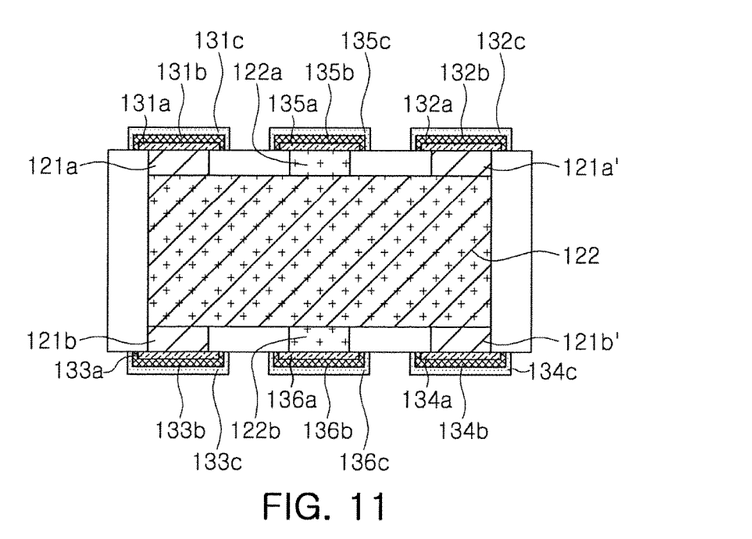
FIG. 11 is a cross-sectional view illustrating the multilayer ceramic capacitor of FIG. 8.

FIG. 8 is a perspective view schematically illustrating a multilayer ceramic capacitor according to another exemplary embodiment in the present disclosure; FIG. 9 is a perspective view illustrating a ceramic body of the multilayer ceramic capacitor of FIG. 8; FIG. 10 is an exploded perspective view illustrating the multilayer ceramic capacitor of FIG. 8 in a state in which external electrodes thereof are omitted; and FIG. 11 is a cross-sectional view illustrating the multilayer ceramic capacitor of FIG. 8.

Here, since a structure of a ceramic body 110 in the present exemplary embodiment is the same as that in the previous exemplary embodiment, a detailed description thereof will be omitted in order to avoid an overlapped description, and fourth to sixth external electrodes 131, 132, and 135 and first and second internal electrodes 121 and 122 having different structures from those in the previous exemplary embodiment will be described in detail.

Referring to FIGS. 8 through 11, in a multilayer ceramic capacitor 100" according to the present exemplary embodiment, the fourth to sixth external electrodes 131, 132, 135 may be disposed on a second main surface S2 of the ceramic body 110 so as to face first to third external electrodes 133, 134, and 136.

In this case, if necessary, the fourth to sixth external electrodes 131, 132, and 135 may be extended to portions of third and fourth side surfaces S5 and S6 of the ceramic body 110 in the width direction thereof.

The fourth to sixth external electrodes 131, 132, and 135 may have a three layer structure and include fourth to sixth conductive layers 131a, 132a, and 135a connected to the corresponding lead portions of the internal electrodes, respectively, fourth to sixth nickel (Ni) plating layers 131*b*, 132*b*, and 135*b* formed to cover the fourth to sixth conductive layers 131*a*, 132*a*, and 135*a*, and fourth to sixth tin (Sn) plating layers 131*c*, 132*c*, and 135*c* formed to cover the fourth to sixth nickel plating layers 131*b*, 132*b*, and 135*b*.

The first internal electrode 121 may have fourth and fifth lead portions 121*a* and 121*a'* exposed to the second main surface S2 of the ceramic body 110 to thereby be connected to the fourth and fifth external electrodes 131 and 132 formed on the second main surface S2 of the ceramic body 110, respectively.

The second internal electrode 122 may have a sixth lead portion 122*a* disposed between the fourth and fifth lead portions 121*a* and 121*a'* and exposed to the second main surface S2 of the ceramic body 110 to thereby be connected to the sixth external electrode 135.

As described above, in the case in which internal and external electrode structures of the multilayer ceramic capacitor 100" are formed to be vertically symmetric to each other, there is no need to consider directionality of the capacitor when the capacitor is mounted on a board.

That is, since any of the first and second main surfaces S1 and S2 of the multilayer ceramic capacitor 100" can be used as a mounting surface, at the time of mounting the multilayer ceramic capacitor 100" on a board, there is no need to consider a direction of the mounting surface.

Board Having Multilayer Ceramic Capacitor

Figure 12:
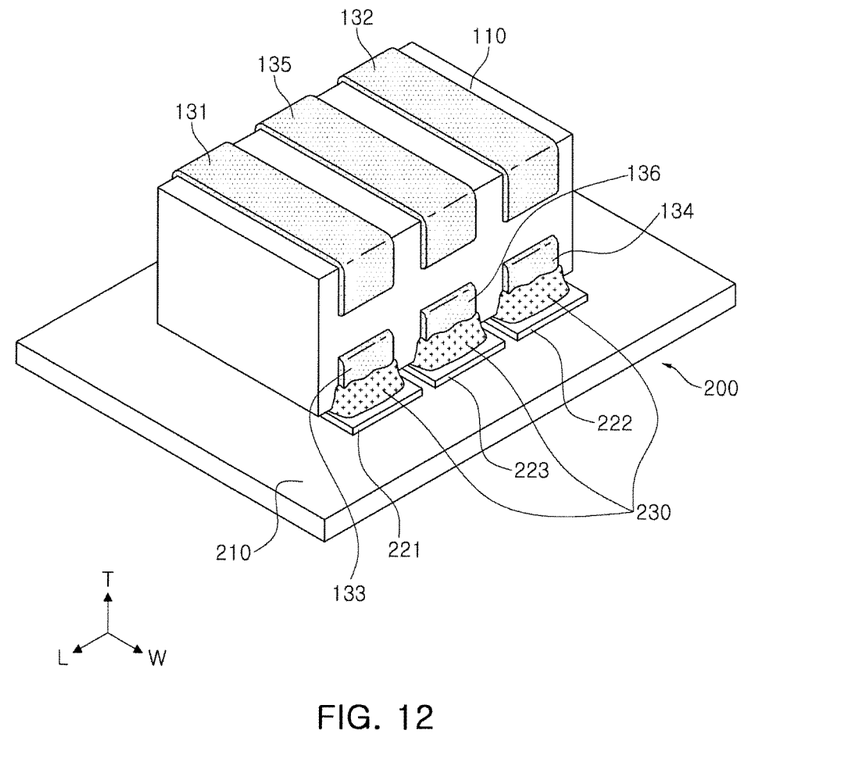
FIG. 12 is a perspective view illustrating the multilayer ceramic capacitor of FIG. 8 mounted on a board.
Figure 13:
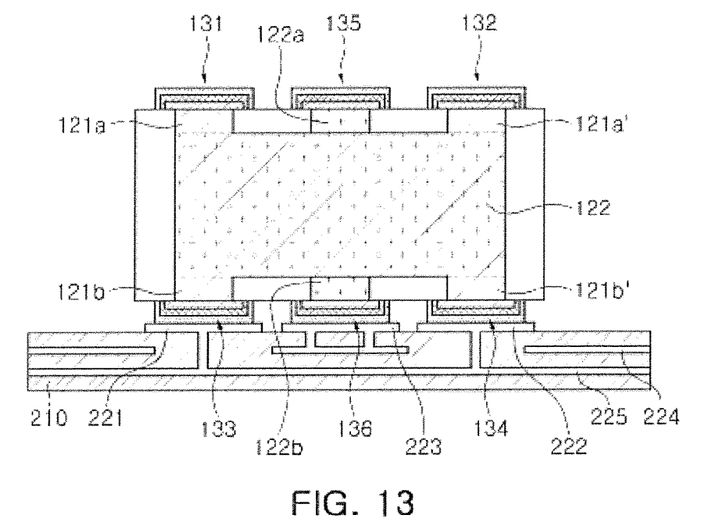
FIG. 13 is a cross-sectional view illustrating the multilayer ceramic capacitor of FIG. 8 mounted on a board.

FIG. 12 is a perspective view illustrating the multilayer ceramic capacitor of FIG. 8 mounted on a board, and FIG. 13 is a cross-sectional view illustrating the multilayer ceramic capacitor of FIG. 8 mounted on a board.

Referring to FIGS. 12 and 13, a board 200 having a multilayer ceramic capacitor according to the present exemplary embodiment may include a circuit board 210 on which the multilayer ceramic capacitor is horizontally mounted and first to third electrode pads 221 to 223 formed on the circuit board 210 to be spaced apart from each other.

In this case, the multilayer ceramic capacitor may be electrically connected to the circuit board 210 using solders 230 in a state in which the first to third external electrodes 133, 134, and 136 are positioned to contact the first to third electrode pads 221 to 223, respectively.

In FIG. 13, a reference numeral 224 indicates a ground terminal, and a reference numeral 225 indicates a power terminal.

Meanwhile, although the case in which the multilayer ceramic capacitor of FIG. 8 is mounted is described in the present exemplary embodiment, the present disclosure is not limited thereto. As an example, the multilayer ceramic capacitors shown in FIGS. 1 and 5 may be similarly mounted on a circuit board to thereby configure boards having respective multilayer ceramic capacitors.

As set forth above, according to exemplary embodiments in the present disclosure, the width of a current path may be maintained by miniaturizing a chip size only in a length direction of a ceramic body at the time of miniaturizing a multilayer ceramic capacitor having a 3-terminal vertical structure, such that an increase in ESL of the multilayer ceramic capacitor caused by the miniaturization thereof may be prevented, whereby low ESL characteristics of the multilayer ceramic capacitor may be obtained.

While exemplary embodiments have been shown and described above, it will be apparent to those skilled in the art that modifications and variations could be made without departing from the scope of the present invention as defined by the appended claims.

What is claimed is:

1. A multilayer ceramic capacitor comprising:
   a ceramic body including a plurality of dielectric layers stacked therein in a width direction thereof;
   an active region including a plurality of first and second internal electrodes alternately disposed, having one of the dielectric layers interposed therebetween;
   first and second lead portions extending from the first internal electrode so as to be exposed to a mounting surface of the ceramic body, and disposed to be spaced apart from each other in a length direction of the ceramic body;
   a third lead portion extending from the second internal electrode so as to be exposed to the mounting surface of the ceramic body, and disposed between the first and second lead portions;
   first and second external electrodes disposed on the mounting surface of the ceramic body to be spaced apart from each other in the length direction thereof, and connected to the first and second lead portions, respectively; and
   a third external electrode disposed on the mounting surface of the ceramic body between the first and second external electrodes, and connected to the third lead portion;
   wherein A/L is in a range of 0.64 to 1.14 ($0.64 \leq A/L \leq 1.14$), in which L is a length of the ceramic body determined in the length direction and A is a width of the active region determined in the width direction, and W/L is in a range of 0.7 to 1.2 ($0.7 \leq W/L \leq 1.2$), in which W is a width of the ceramic body determined in the width direction.

2. The multilayer ceramic capacitor of claim 1, wherein W/L is in a range of 0.7 to 1.0.

3. The multilayer ceramic capacitor of claim 1, wherein the length L of the ceramic body is greater than 0.8 mm.

4. The multilayer ceramic capacitor of claim 1, wherein the first and second internal electrodes are disposed to be spaced apart from both end surfaces of the ceramic body in the length direction thereof.

5. The multilayer ceramic capacitor of claim 1, further comprising cover layers disposed on both side surfaces of the active region in the width direction.

6. The multilayer ceramic capacitor of claim 1, wherein the first to third external electrodes extend from the mounting surface of the ceramic body to portions of both side surfaces of the ceramic body in the width direction.

7. The multilayer ceramic capacitor of claim 1, further comprising:
   fourth and fifth lead portions extending from the first internal electrode so as to be exposed to a surface of the ceramic body opposing the mounting surface of the ceramic body, and disposed to be spaced apart from each other in the length direction thereof;
   a sixth lead portion extending from the second internal electrode to be exposed to the surface of the ceramic body opposing the mounting surface of the ceramic body, and disposed between the fourth and fifth lead portions; and
   an insulating layer disposed on the surface of the ceramic body opposing the mounting surface of the ceramic body.

8. The multilayer ceramic capacitor of claim 1, further comprising:
   fourth and fifth lead portions extending from the first internal electrode so as to be exposed to a surface of the ceramic body opposing the mounting surface of the ceramic body, and disposed to be spaced apart from each other in the length direction thereof;

a sixth lead portion extending from the second internal electrode so as to be exposed to the surface of the ceramic body opposing the mounting surface of the ceramic body, and disposed between the fourth and fifth lead portions;

fourth and fifth external electrodes disposed on the surface of the ceramic body opposing the mounting surface of the ceramic body to be spaced apart from each other in the length direction thereof, and connected to the fourth and fifth lead portions, respectively; and a sixth external electrode disposed between the fourth and fifth external electrodes, extending from the surface of the ceramic body opposing the mounting surface of the ceramic body to portions of both side surfaces of the ceramic body in the width direction thereof, and connected to the sixth lead portion.

9. The multilayer ceramic capacitor of claim 8, wherein the fourth to sixth external electrodes extending from the surface of the ceramic body opposing the mounting surface of the ceramic body to portions of both side surfaces of the ceramic body in the width direction thereof.

10. A board having a multilayer ceramic capacitor comprising:
   a circuit board on which first to third electrode pads are disposed; and
   the multilayer ceramic capacitor of claim 9 of which the first to third external electrodes are mounted on the first to third electrode pads, respectively.

11. A board having a multilayer ceramic capacitor comprising:
   a circuit board on which first to third electrode pads are disposed; and
   the multilayer ceramic capacitor of claim 8 of which the first to third external electrodes are mounted on the first to third electrode pads, respectively.

12. A board having a multilayer ceramic capacitor comprising:
   a circuit board on which first to third electrode pads are disposed; and
   the multilayer ceramic capacitor of claim 1 of which the first to third external electrodes are mounted on the first to third electrode pads, respectively.

13. A multilayer ceramic capacitor comprising:
   a ceramic body including a plurality of dielectric layers stacked therein in a width direction thereof;
   an active region including a plurality of first and second internal electrodes alternately disposed, having one of the dielectric layers interposed therebetween;
   first and second lead portions extending from the first internal electrode so as to be exposed to a mounting surface of the ceramic body, and disposed to be spaced apart from each other in a length direction of the ceramic body;
   a third lead portion extending from the second internal electrode so as to be exposed to the mounting surface of the ceramic body, and disposed between the first and second lead portions;
   first and second external electrodes disposed on the mounting surface of the ceramic body to be spaced apart from each other in the length direction thereof, and connected to the first and second lead portions, respectively; and
   a third external electrode disposed on the mounting surface of the ceramic body between the first and second external electrodes, and connected to the third lead portion,
   wherein A/L is in a range of 0.94 or less (A/L≤0.94), in which L is a length of the ceramic body determined in the length direction and A is a width of the active region determined in the width direction, and
   W/L is in a range of 0.7 to 1.2 (0.7≤W/L≤1.2), in which W is a width of the ceramic body determined in the width direction.

14. The multilayer ceramic capacitor of claim 13, wherein W/L is in a range of 0.7 to 1.0.

15. The multilayer ceramic capacitor of claim 13, wherein the length of the ceramic body is greater than 0.8 mm.

16. The multilayer ceramic capacitor of claim 13, wherein the first and second internal electrodes are disposed to be spaced apart from both end surfaces of the ceramic body in the length direction thereof.

17. The multilayer ceramic capacitor of claim 13, further comprising cover layers disposed on both side surfaces of the active region in the width direction.

18. The multilayer ceramic capacitor of claim 13, wherein the first to third external electrodes extend from the mounting surface of the ceramic body to portions of both side surfaces of the ceramic body in the width direction.

19. The multilayer ceramic capacitor of claim 13, further comprising:
   fourth and fifth lead portions extending from the first internal electrode so as to be exposed to a surface of the ceramic body opposing the mounting surface of the ceramic body, and disposed to be spaced apart from each other in the length direction thereof;
   a sixth lead portion extending from the second internal electrode to be exposed to the surface of the ceramic body opposing the mounting surface of the ceramic body, and disposed between the fourth and fifth lead portions; and
   an insulating layer disposed on the surface of the ceramic body opposing the mounting surface of the ceramic body.

20. A board having a multilayer ceramic capacitor comprising:
   a circuit board on which first to third electrode pads are disposed; and
   the multilayer ceramic capacitor of claim 19 of which the first to third external electrodes are mounted on the first to third electrode pads, respectively.

21. The multilayer ceramic capacitor of claim 13, further comprising:
   fourth and fifth lead portions extending from the first internal electrode so as to be exposed to a surface of the ceramic body opposing the mounting surface of the ceramic body, and disposed to be spaced apart from each other in the length direction thereof;
   a sixth lead portion extending from the second internal electrode so as to be exposed to the surface of the ceramic body opposing the mounting surface of the ceramic body, and disposed between the fourth and fifth lead portions;
   fourth and fifth external electrodes disposed on the surface of the ceramic body opposing the mounting surface of the ceramic body to be spaced apart from each other in the length direction thereof, and connected to the fourth and fifth lead portions, respectively; and
   a sixth external electrode disposed between the fourth and fifth external electrodes, extending from the surface of the ceramic body opposing the mounting surface of the ceramic body to portions of both side surfaces of the ceramic body in the width direction thereof, and connected to the sixth lead portion.

22. The multilayer ceramic capacitor of claim 21, wherein the fourth to sixth external electrodes extend from the surface of the ceramic body opposing the mounting surface of the ceramic body to portions of both side surfaces of the ceramic body in the width direction thereof.

23. A board having a multilayer ceramic capacitor comprising:
   a circuit board on which first to third electrode pads are disposed; and
   the multilayer ceramic capacitor of claim 13 of which the first to third external electrodes are mounted on the first to third electrode pads, respectively.

* * * * *